(12) United States Patent  
Pupalaikis et al.

(10) Patent No.: US 8,706,438 B2  
(45) Date of Patent: Apr. 22, 2014

(54) TIME DOMAIN NETWORK ANALYZER

(75) Inventors: Peter J Pupalaikis, Ramsey, NJ (US); Kaviyesh Doshi, Emerson, NJ (US); Roger Delbue, Monroe, NY (US); Anirudh Sureka, Mamaroneck, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 346 days.

(21) Appl. No.: 13/017,360

(22) Filed: Jan. 31, 2011

(65) Prior Publication Data

US 2011/0191054 A1  Aug. 4, 2011

Related U.S. Application Data

(60) Provisional application No. 61/300,065, filed on Feb. 1, 2010.

(51) Int. Cl.  
*G06F 19/00* (2011.01)

(52) U.S. Cl.  
USPC ............ 702/109; 702/69; 702/57; 702/85; 702/185; 324/601; 324/638; 324/642

(58) Field of Classification Search  
USPC ........ 702/69, 57, 85, 109, 185; 324/601, 638, 324/642  
See application file for complete search history.

(56) References Cited

U.S. PATENT DOCUMENTS

| | | | |
|---|---|---|---|
| 4,507,602 A * | 3/1985 | Aguirre ..................... 324/638 |
| 4,641,085 A * | 2/1987 | Donecker et al. ......... 324/76.22 |
| 4,816,767 A * | 3/1989 | Cannon et al. ............. 324/601 |
| 5,122,800 A * | 6/1992 | Philipp ..................... 341/156 |
| 5,502,392 A * | 3/1996 | Arjavalingam et al. ...... 324/638 |
| 5,578,932 A | 11/1996 | Adamian |
| 5,587,934 A | 12/1996 | Oldfield et al. |
| 5,715,183 A * | 2/1998 | Grace et al. ................. 702/85 |
| 6,529,844 B1 * | 3/2003 | Kapetanic et al. ........... 702/85 |
| 6,614,237 B2 * | 9/2003 | Ademian et al. ............ 324/601 |
| 6,826,506 B2 * | 11/2004 | Adamian et al. ............ 702/118 |
| 6,853,198 B2 * | 2/2005 | Boudiaf et al. ............. 324/601 |
| 7,030,625 B1 * | 4/2006 | Boudiaf et al. ............. 324/601 |
| 7,068,049 B2 * | 6/2006 | Adamian .................... 324/638 |
| 7,075,312 B2 * | 7/2006 | Fabry et al. ................ 324/601 |
| 7,113,891 B2 * | 9/2006 | Anderson ................... 702/186 |
| 7,283,594 B1 * | 10/2007 | Wood ......................... 375/278 |
| 7,652,484 B2 * | 1/2010 | Wong et al. ................ 324/601 |
| 7,924,024 B2 * | 4/2011 | Martens et al. ............ 324/601 |
| 2002/0053898 A1 * | 5/2002 | Ademian et al. .......... 324/76.19 |
| 2003/0173978 A1 * | 9/2003 | Adamian et al. ........... 324/638 |
| 2004/0193382 A1 * | 9/2004 | Adamian et al. ........... 702/118 |
| 2005/0030047 A1 * | 2/2005 | Adamian .................... 324/650 |

OTHER PUBLICATIONS

"Applying Error Correction to Network Analyzer Measurements", *Agilent AN 1287-3 Application Note*, (2002), 1-16.

Wittwer, Peter et al., "A General Closed-Form Solution to Multi-Port Scattering Parameter Calculations", *72nd ARFTG Microwave Measurement Conference*, (Dec. 2008), 137-143.

Pupalaikis, Peter J., et al., U.S. Appl. No. 13/017,394, filed Jan. 31, 2011, Entitled: *Time Domain Reflectory Step to S-Parameter Conversion*.

* cited by examiner

*Primary Examiner* — Carol S Tsai  
(74) *Attorney, Agent, or Firm* — Gordon Kessler

(57) ABSTRACT

An apparatus for measuring s-parameters using as few as one pulser and two samplers is described. The apparatus calibrates itself automatically using the internal calibration standards.

13 Claims, 13 Drawing Sheets

| Meas # | Meas Type | Pulser-Sampler Meas | Driven Dut Port | Measured Dut Port | RS1 | RS3 | RS4 | RD1 | RD2 | RD3 | RD4 |
|---|---|---|---|---|---|---|---|---|---|---|---|
| 1 | Cal | TRUE | 0 | 0 | S | RD1 | RD4 | T | T | T | T |
| 2 | Cal | TRUE | 0 | 0 | O | RD1 | RD4 | T | T | T | T |
| 3 | Cal | TRUE | 0 | 0 | L | RD1 | RD4 | T | T | T | T |
| 4 | Cal | TRUE | 0 | 0 | RS4 | RD1 | RS1 | T | T | T | T |
| 5 | Cal | FALSE | 0 | 0 | RS4 | RD1 | RS1 | T | T | T | T |
| 6 | Dut | TRUE | 1 | 1 | RS3 | RD1 | RD2 | RS3 | RS4 | T | T |
| 7 | Dut | FALSE | 1 | 2 | RS3 | RD1 | RD2 | RS3 | RS4 | T | T |
| 8 | Dut | TRUE | 2 | 2 | RS3 | RD2 | RD1 | RS4 | RS3 | T | T |
| 9 | Dut | FALSE | 2 | 1 | RS3 | RD2 | RD1 | RS4 | RS3 | T | T |
| 10 | Dut | TRUE | 1 | 1 | RS3 | RD1 | RD3 | RS3 | T | RS4 | T |
| 11 | Dut | FALSE | 1 | 3 | RS3 | RD1 | RD3 | RS3 | T | RS4 | T |
| 12 | Dut | TRUE | 3 | 3 | RS3 | RD3 | RD1 | RS4 | T | RS3 | T |
| 13 | Dut | FALSE | 3 | 1 | RS3 | RD3 | RD1 | RS4 | T | RS3 | T |
| 14 | Dut | TRUE | 1 | 1 | RS3 | RD1 | RD4 | RS3 | T | T | RS4 |
| 15 | Dut | FALSE | 1 | 4 | RS3 | RD1 | RD4 | RS3 | T | T | RS4 |
| 16 | Dut | TRUE | 4 | 4 | RS3 | RD4 | RD1 | RS4 | T | T | RS3 |
| 17 | Dut | FALSE | 4 | 1 | RS3 | RD4 | RD1 | RS4 | T | T | RS3 |
| 18 | Dut | TRUE | 2 | 2 | RS3 | RD2 | RD3 | T | RS3 | RS4 | T |
| 19 | Dut | FALSE | 2 | 3 | RS3 | RD2 | RD3 | T | RS3 | RS4 | T |
| 20 | Dut | TRUE | 3 | 3 | RS3 | RD3 | RD2 | T | RS4 | RS3 | T |
| 21 | Dut | FALSE | 3 | 2 | RS3 | RD3 | RD2 | T | RS4 | RS3 | T |
| 22 | Dut | TRUE | 2 | 2 | RS3 | RD2 | RD4 | T | RS3 | T | RS4 |
| 23 | Dut | FALSE | 2 | 4 | RS3 | RD2 | RD4 | T | RS3 | T | RS4 |
| 24 | Dut | TRUE | 4 | 4 | RS3 | RD4 | RD2 | T | RS4 | T | RS3 |
| 25 | Dut | FALSE | 4 | 2 | RS3 | RD4 | RD2 | T | RS4 | T | RS3 |
| 26 | Dut | TRUE | 3 | 3 | RS3 | RD3 | RD4 | T | T | RS3 | RS4 |
| 27 | Dut | FALSE | 3 | 4 | RS3 | RD3 | RD4 | T | T | RS3 | RS4 |
| 28 | Dut | TRUE | 4 | 4 | RS3 | RD4 | RD3 | T | T | RS4 | RS3 |
| 29 | Dut | FALSE | 4 | 3 | RS3 | RD4 | RD3 | T | T | RS4 | RS3 |

FIG. 11

| Meas # | Meas Type | Pulser-Sampler Meas | Driven Dut Port | Measured Dut Port | RS1 | RS3 | RS4 | RD1 | RD2 | RD3 | RD4 |
|---|---|---|---|---|---|---|---|---|---|---|---|
| 1 | Cal | TRUE | 0 | 0 | S | RD1 | RD4 | T | T | T | T |
| 2 | Cal | TRUE | 0 | 0 | O | RD1 | RD4 | T | T | T | T |
| 3 | Cal | TRUE | 0 | 0 | L | RD1 | RD4 | T | T | T | T |
| 4 | Cal | TRUE | 0 | 0 | RS4 | RD1 | RS1 | T | T | T | T |
| 5 | Cal | FALSE | 0 | 0 | RS4 | RD1 | RS1 | T | T | T | T |
| 6 | Dut | TRUE | 1 | 1 | RS3 | RD1 | RD2 | RS3 | RS4 | T | T |
| 7 | Dut | FALSE | 1 | 2 | RS3 | RD1 | RD2 | RS3 | RS4 | T | T |
| 8 | Dut | TRUE | 2 | 2 | RS3 | RD2 | RD1 | RS4 | RS3 | T | T |
| 9 | Dut | FALSE | 2 | 1 | RS3 | RD2 | RD1 | RS4 | RS3 | T | T |
| 10 | Dut | TRUE | 1 | 1 | RS3 | RD1 | RD3 | RS3 | T | RS4 | T |
| 11 | Dut | FALSE | 1 | 3 | RS3 | RD1 | RD3 | RS3 | T | RS4 | T |
| 12 | Dut | TRUE | 3 | 3 | RS3 | RD3 | RD1 | RS4 | T | RS3 | T |
| 13 | Dut | FALSE | 3 | 1 | RS3 | RD3 | RD1 | RS4 | T | RS3 | T |
| 14 | Dut | TRUE | 2 | 2 | RS3 | RD2 | RD3 | T | RS3 | RS4 | T |
| 15 | Dut | FALSE | 2 | 3 | RS3 | RD2 | RD3 | T | RS3 | RS4 | T |
| 16 | Dut | TRUE | 3 | 3 | RS3 | RD3 | RD2 | T | RS4 | RS3 | T |
| 17 | Dut | FALSE | 3 | 2 | RS3 | RD3 | RD2 | T | RS4 | RS3 | T |

FIG. 12

| Meas # | Meas Type | Pulser-Sampler Meas | Driven Dut Port | Measured Dut Port | RS1 | RS3 | RS4 | RD1 | RD2 | RD3 | RD4 |
|---|---|---|---|---|---|---|---|---|---|---|---|
| 1 | Cal | TRUE | 1 | 1 | RS3 | RD1 | RD2 | RS3 | T | T | T |
| 2 | Cal | TRUE | 1 | 1 | RS3 | RD1 | RD2 | RS3 | T | T | T |
| 3 | Cal | TRUE | 1 | 1 | RS3 | RD1 | RD2 | RS3 | T | T | T |
| 4 | Cal | TRUE | 2 | 2 | RS3 | RD2 | RD1 | T | T | T | T |
| 5 | Cal | TRUE | 2 | 2 | RS3 | RD2 | RD1 | T | T | T | T |
| 6 | Cal | TRUE | 2 | 2 | RS3 | RD2 | RD1 | T | T | T | T |
| 7 | Cal | TRUE | 1 | 1 | RS3 | RD1 | RD2 | RS3 | RS3 | T | T |
| 8 | Cal | FALSE | 1 | 2 | RS3 | RD1 | RD2 | RS3 | RS4 | T | T |
| 9 | Cal | TRUE | 2 | 2 | RS3 | RD2 | RD1 | RS4 | RS3 | T | T |
| 10 | Cal | FALSE | 2 | 1 | RS3 | RD2 | RD1 | RS4 | RS4 | T | T |
| 11 | Dut | TRUE | 1 | 1 | RS3 | RD1 | RD2 | RS3 | RS3 | T | T |
| 12 | Dut | FALSE | 1 | 2 | RS3 | RD1 | RD2 | RS3 | RS4 | T | T |
| 13 | Dut | TRUE | 2 | 2 | RS3 | RD2 | RD1 | RS4 | RS3 | T | T |
| 14 | Dut | FALSE | 2 | 1 | RS3 | RD2 | RD1 | RS4 | RS3 | T | T |

FIG. 14

TIME DOMAIN NETWORK ANALYZER

CROSS-REFERENCE TO RELATED APPLICATIONS

This invention claims the benefit of U.S. Provisional Patent Application Ser. No. 61/300,065, filed Feb. 1, 2010, titled TIME DOMAIN NETWORK ANALYZER, the contents thereof being incorporated herein by reference.

FIELD OF THE INVENTION

This invention is related generally to the measurement of the s-parameters of a network, and more particularly to a method and system for automatically performing calibration of such a test apparatus for measuring such s-parameters utilizing as few as one pulser and two samplers, and for determining such s-parameters after automatic calibration (without any user involvement) of the test apparatus.

BACKGROUND OF THE INVENTION

Network analyzers are instruments that characterize networks. The characterization result is based on conventions and define how the network will perform under various conditions. In signal integrity applications, the common network parameters in use are scattering parameters, or s-parameters. S-parameters define port to port relationships in a network when the network is driven by a source whose impedance is set to the reference impedance and all other ports are terminated in that same reference impedance. This convention allows scattering parameters to completely define the behavior of a network under any other driving and termination conditions.

The standard instrument for s-parameter measurement is the vector network analyzer (VNA). This instrument stimulates a network with sinusoidal incident waveforms and measures the reflected sinusoidal waveforms at the network ports. This instrument is most commonly used in the field of microwave analysis.

Another instrument used for s-parameter measurement uses techniques called time domain reflectometry (TDR) and time domain transmission (TDT) (the commonly used acronym TDR will be used to represent both techniques, the name of the instrument itself, and time domain analysis in general). TDR stimulates a network with an incident step, or a step-like waveform and measures reflected waveforms at the network ports. This instrument is most commonly used in the field of signal integrity.

FIG. 1 shows a d-port (d≥1) network including a device under test (DUT) [1], "$ps_k$" [2], indicates k-th pulser-sampler. The device under test (DUT) [1] has unknown s-parameters and it is desired to measure and determine these s-parameters in order to characterize the device. Each pulser-sampler device has a pulser that is capable of sending a stimulus signal and a sampler that measures the signal reflected from DUT [1]. S-parameters of the DUT [1] define the port to port transfer function of the DUT. For example, $$S_{kk} = \frac{b_k}{a_k}, \quad (1)$$

is the transfer function for port k that characterizes the reflection coefficient of port k. Here $a_k$ is the frequency domain representation of the input signal to port k of the DUT and $b_k$ is the frequency domain representation of the signal reflected from port k of the DUT. All the other ports of the DUT are terminated so that no signal reflects from those ports. Similarly, $$S_{jk} = \frac{b_j}{a_k}, \quad (2)$$

defines the transmission coefficient between ports k and j. Here $a_k$ is the frequency domain representation of the input signal to port k of the DUT and $b_j$ is the frequency domain representation of the signal that gets transmitted from port k of the DUT to port j of the DUT. All the other ports of the DUT are terminated so that no signal reflects from those ports. Also, under ideal conditions, the sampler is such that it does not reflect any incoming signal. To measure the s-parameters of the d port DUT [1], reflected waves received at, and returned via, the d ports of the device would be measured under d independent measurement conditions. The equations that relate, for each measurement condition m∈{1, ..., d}, the reflected waves to the incident waves are shown in Equation 3, below:

$$\begin{bmatrix} s_{11} & s_{12} & \cdots & s_{1d} \\ s_{21} & s_{22} & \cdots & s_{2d} \\ \cdots & \cdots & \ddots & \cdots \\ s_{d1} & s_{d2} & \cdots & s_{dd} \end{bmatrix} \cdot \begin{bmatrix} a_{1m} \\ a_{2m} \\ \cdots \\ a_{dm} \end{bmatrix} = \begin{bmatrix} b_{1m} \\ b_{2m} \\ \cdots \\ b_{dm} \end{bmatrix} \quad (3)$$

where, for i∈{1, ..., d}, $a_{im}$ is a complex number corresponding to amplitude and phase of the incident wave at port i under measurement condition m, and where $b_{im}$ is a complex number corresponding to amplitude and phase of the reflected wave at port under measurement condition m. Ideally, one would apply stimuli to each of the d ports under d unique measurement conditions (i.e., define the incident waves $a_{im}$) and then measure the reflected waves at each of the d ports under these d measurement conditions (i.e., measure $b_{im}$) in order to determine the unknown s-parameters. If the matrices A=($a_{im}$) and B=($b_{im}$) are defined, then the matrix S=($s_{im}$) of unknown s-parameters is S=B·A$^{-1}$.

Note that the pulser-sampler device shown in FIG. 1 may be a combination of the pulser and the sampler or it may be two separate devices. For convenience, in all the subsequent figures, they are represented as one device and are meant to imply one pulser and one sampler. Also, a pulser may comprise a TDR step like source or an impulse like source or may correspond to a VNA source or that of any VNA-like instrument's signal source. The purpose of such a pulser is to excite the DUT port with a stimulus signal with desired frequencies. Similarly a sampler may comprise of a TDR sampler capable of measuring a step like waveform or an impulse like waveform, or a VNA like receiver. The purpose of such a sampler is to measure the signal coming from the DUT ports. For the purpose of this application a device capable of sending such a signal is referred to as a pulser and a device capable of measuring the incoming signal will be referred to as a sampler.

In practice, the pulsers and samplers are non-ideal. One needs cables and connectors to connect the DUT to these pulsers and samplers. The cables and connectors can be lossy. There can be a mismatch in impedance of cables and connectors. These non-idealities result in systematic errors in the measurements of s-parameters. In order to eliminate such errors, the measuring device needs to be calibrated. A process of calibration involves first assuming a model for such systematic errors. Such a model is referred to as an error term model. The coefficients of this model are calculated using a calibration procedure. Calibration procedure involves connecting a device with known characteristics (known s-parameters for example) instead of a DUT. Such a device is referred to as a calibration standard. An input signal is applied and the reflections due to this known device is measured. Multiple such known calibrations standards are connected and responses measured. All these measurements and the known characteristics of the calibration standards are used to generate the coefficients of the error term model ("Error terms from calibration [3]" in FIG. 2). Currently there are different calibration techniques in the literature, for example Short-Open-Load-Thru (SOLT) calibration, Thru-Reflect-Line (TRL) calibration etc. The most commonly used calibration method is the SOLT method that uses known short, open, load and thru calibration standards. The most commonly used error term model is the 12-term error model described in "Agilent AN 1287-3 Applying Error Correction to Network Analyzer Measurements—Application Note". For each of these calibration techniques the reference plane is defined as the interface where these calibration standards are connected. All the subsequent s-parameter measurements made at this plane are referred to as raw s-parameters. Calibrated s-parameters are then calculated from these raw s-parameters and the error term model by using the algorithm described in "A General, Closed Form Solution to Multi-port S-Parameter Calculations 72nd ARFTG Microwave Measurement Conference December 2008".

There are a number of drawbacks in measuring s-parameters utilizing prior art procedures:

The calibration is performed manually by connecting the calibration standards at the end of the measuring instrument. Besides being a time consuming exercise prone to operator errors, it also results in the mechanical wear and tear of the calibration standards.

The number of pulser-sampler blocks increases with the number of DUT ports, thereby increasing the cost of providing a device to perform such measurements. To circumvent the problem, there have been proposed methods that use a switch matrix that connects a two port VNA or VNA-like instrument to an N-port DUT. For example U.S. Pat. No. 5,578,932 by Vahe Adamian provides one such description.

Currently there are automatic calibration instruments available. U.S. Pat. No. 5,587,934 by Oldfield et al. provides one such description. But even these instruments suffer from the limitation of manually connecting them to the measuring device for calibration and disconnecting them to connect the DUT to the measuring instrument.

What is needed is a measuring instrument that can calibrate itself without requiring an operator to connect different calibration standards. What is also needed is a measuring instrument whose cost remains within reasonable bounds with the increase in number of ports in the network.

OBJECTS OF THE INVENTION

It is the object of the invention to provide an improved method and apparatus that overcomes the drawbacks of the prior art.

Still other objects and advantages of the invention will in part be obvious and will in part be apparent from the specification and the drawings.

SUMMARY OF THE INVENTION

To alleviate the above mentioned problems, the inventors of the present invention propose a system shown in FIG. 3. The system preferably consists of a (d+I)-port fixture [5], $L(\leq I)$ pulsers, to apply a pulse input to the system, and $I(\geq 2)$ samplers, to measure reflections at the I ports. Each block shown as "p/$s_k$" [4] indicates a sampler which may or may not also comprise a pulser. Hence the system comprises I samplers and one or more (maximum of I) pulsers. The first I ports of the fixture are connected to the samplers, forming I system ports, i.e. ports where the reflection is measured when an input is applied to any one of the I ports. The remaining d ports of the fixture may be connected to the d ports of the DUT. If DUT has fewer ports, then there would be no external connections to those ports of the fixture. The fixture is a circuit element constructed in accordance with an embodiment of the invention consisting of cables, switches, calibration standards and terminations. In accordance with the invention, such cables and switches of the fixture may be arranged such that a user is able to connect a pulser port to any one of the DUT ports and a sampler port to any one of the DUT ports. The calibration standards are used to calibrate the system to account for the systematic errors due to the pulsers and samplers. The terminations are used to terminate DUT ports that are not connected to any pulser or samplers.

Through an outside control (not shown here), the fixture switches are preferably set to a plurality of desired positions automatically and sequentially, thus providing different paths between the system ports and the DUT ports. Therefore, in accordance with such a system in accordance with the present invention, the steps of:

setting the fixture to a particular configuration,
applying input to one of the system ports, and
measuring the response (reflected waves) of the system at the I system ports are defined as a measurement condition. Thus, in accordance with the invention, the system may automatically and sequentially define multiple independent measurement conditions by using different fixture configurations and different pulser ports. Reflected waves at the I system ports may be measured under M independent measurement conditions to determine the DUT s-parameters.

Besides the step measurements, it may be necessary to acquire various fixture characteristics, such as s-parameters and the like, for example. One way to make these measurements is to disconnect the pulser and the sampler from the fixture and connect the (d+I) port fixture to a VNA or VNA-like instrument, set the switches to configure the fixture in one of the measurement condition, measure the (d+I) port s-parameters and save the file. The procedure must then be repeated for all the measurement conditions.

Thus in order to completely measure the s-parameters of the DUT, a multiple of such switch settings are required, referred to as a sequence of switch settings. Depending on the number of ports in the DUT and the time domain network analyzer (TDNA), a sequence to measure the s-parameters is implemented. For each member in the sequence, the switches are set accordingly and one or more steps are measured and saved. These steps are either a part of the calibration procedure or a part of DUT measurements. Once the sequence is complete, the steps and the fixture information is used to calculate the s-parameters using the algorithm described in copending patent application Ser. No. 13/017,394, filed Jan. 31, 2011, titled Time domain reflectometry step to s-parameter conversion, the entire contents thereof being incorporated herein by reference.

Thus a network analyzer for the present invention may preferably comprise:

One or more pulsers and two or more samplers.

A control system to apply an input signal through any desired pulser and to measure the reflected waveforms by the sampler.

Fixtures consisting of switches, internal calibration standards, terminations and cables connecting them.

A control to set the switches in a desired configuration.

A software medium that stores the s-parameters of fixtures under different conditions.

A system that consumes the measurements made by the pulsers and samplers, and the stored fixture s-parameters and calculates the s-parameters of the DUT as described in this patent.

The invention accordingly comprises the several steps and the relation of one or more of such steps with respect to each of the others, and the apparatus embodying features of construction, combinations of elements and arrangement of parts that are adapted to affect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 11, in accordance with an embodiment of the invention, is a sequence table used to set the switches in order to make measurements necessary for calculating s-parameters of a four port DUT using the TDNA shown in FIG. 4;

FIG. 12, in accordance with an embodiment of the invention, is a sequence table used to set the switches in order to make measurements necessary for calculating s-parameters of a three port DUT using the TDNA shown in FIG. 4;

FIG. 14, in accordance with an embodiment of the invention, is a sequence table used to set the switches in order to make measurements necessary for calculating s-parameters of a two port DUT by manually calibrating the TDNA shown in FIG. 4.

DETAILED DESCRIPTION OF THE PREFERRED EMBODIMENTS

Figure 1:
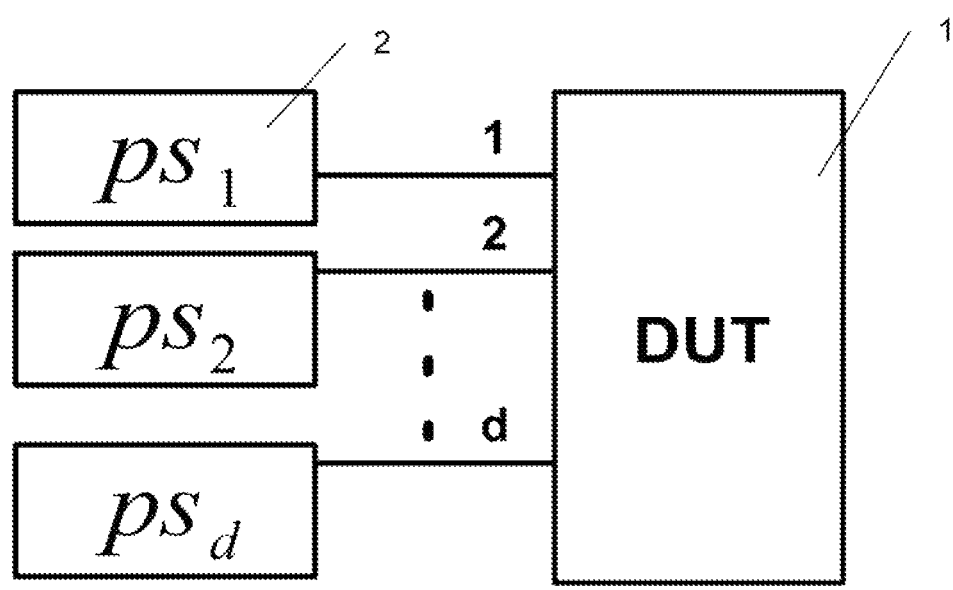
FIG. 1, in accordance with the prior art, is a block diagram of an ideal system for measuring s-parameters of a Device Under Test.
Figure 2:
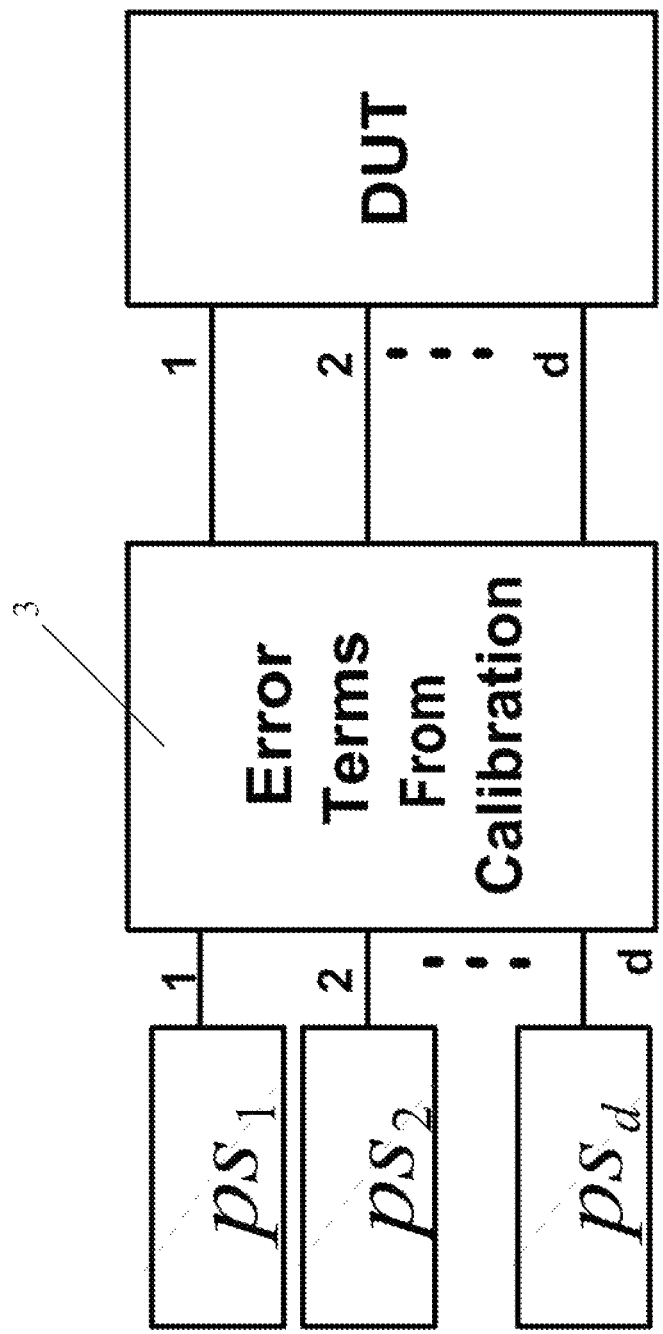
FIG. 2, in accordance with the prior art, is a modification of FIG. 1 to account for systematic errors using the error terms obtained from calibration procedure.
Figure 3:
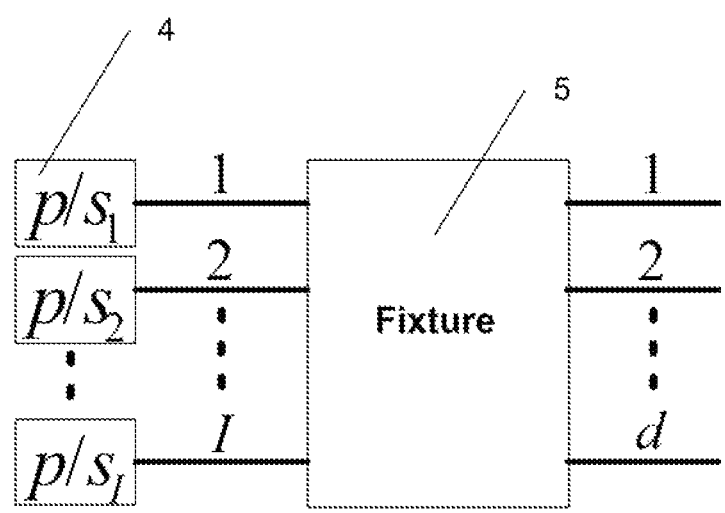
FIG. 3, in accordance with an embodiment of the invention, is a block diagram depicting an embodiment of the time domain network analyzer.
Figure 4:
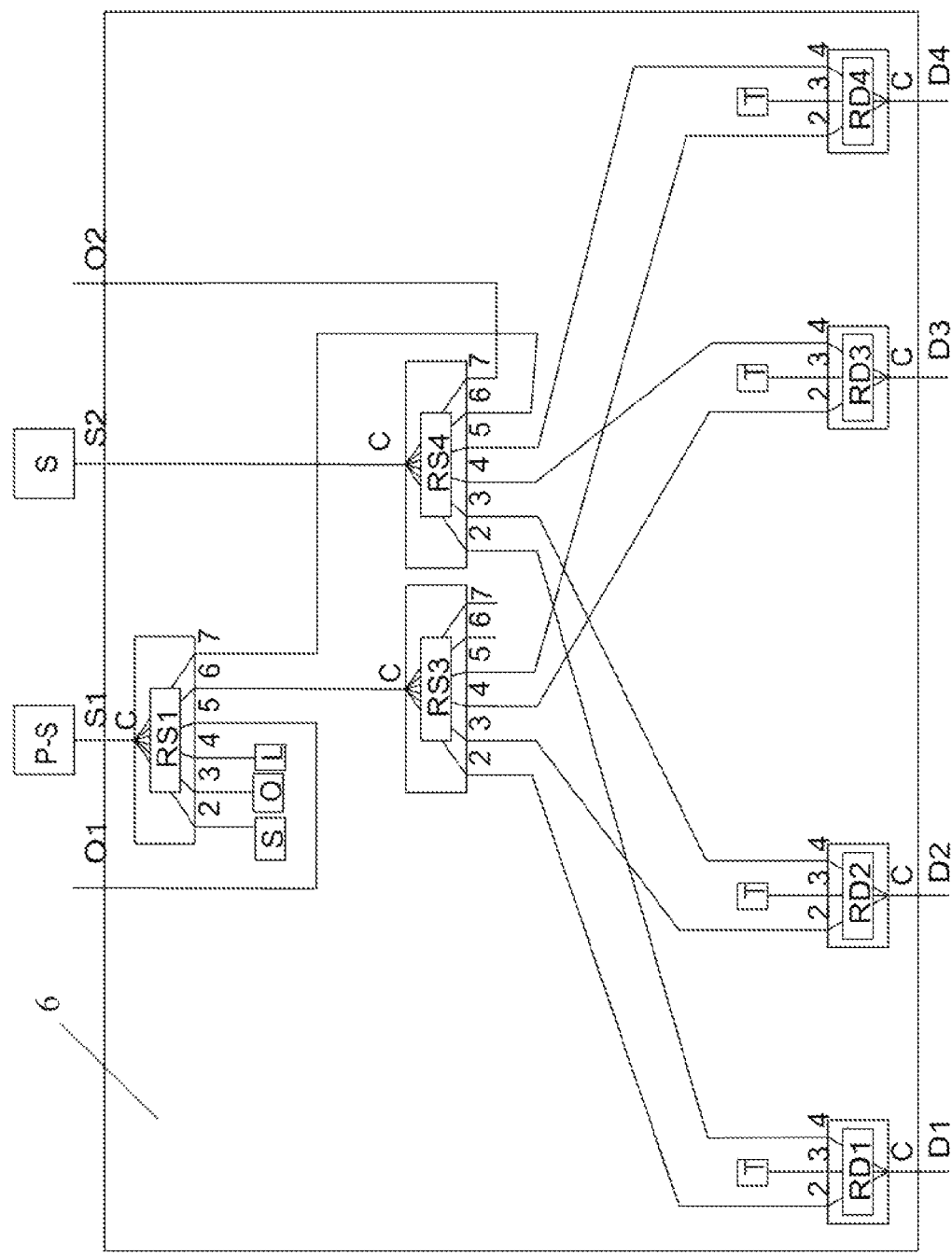
FIG. 4, in accordance with an embodiment of the invention, is a wiring diagram depicting an embodiment of the time domain network analyzer capable of measuring s-parameters of a DUT with up to four ports.

The invention will now be described making reference to the following drawings in which like reference numbers denote like structure or steps. As an example, FIG. 4 shows a preferred embodiment of a TDNA for measuring s-parameters of a DUT with four or less ports in accordance with an embodiment of the invention. The TDNA has one pulser and two samplers. The block "P-S" is preferably connected to a port marked S1 is the pulser-sampler consisting of the pulser and the first sampler. The block "S" is preferably connected to port marked S2 is the other sampler. RS1, RS3, RS4, RD1, RD2, RD3 and RD4 represent different switches, such that their common input connection (denoted by C) can be connected to any one of the several output connections (marked by numbers). These switches can be relays, PIN diodes, Micro electromechanical (MEM) switch or any other similar device. For example, RS1 may be a single pole six throw relay with six possible output connections. The common input of the relay can be connected to any one of the six output positions by switching the relay using an external control signal. Similarly RD1 may be a single pole three throw relay with three possible output connections. S, O, and L collectively coupled to RS1 are the short, open and load calibration standards respectively. T being selectively coupled to RD1, RD2, RD3 and RD4 is a termination device used to terminate a port if not in use. Although the inventors use a load standard as a termination, any known one port device may be used. A DUT may be connected to ports marked D1, D2, D3 and D4. S1 and S2 are the two system ports and may be referred to as the input ports of the six port fixture, and ports D1 through D4 may be referred to as the output ports of the fixture.

Figure 5:
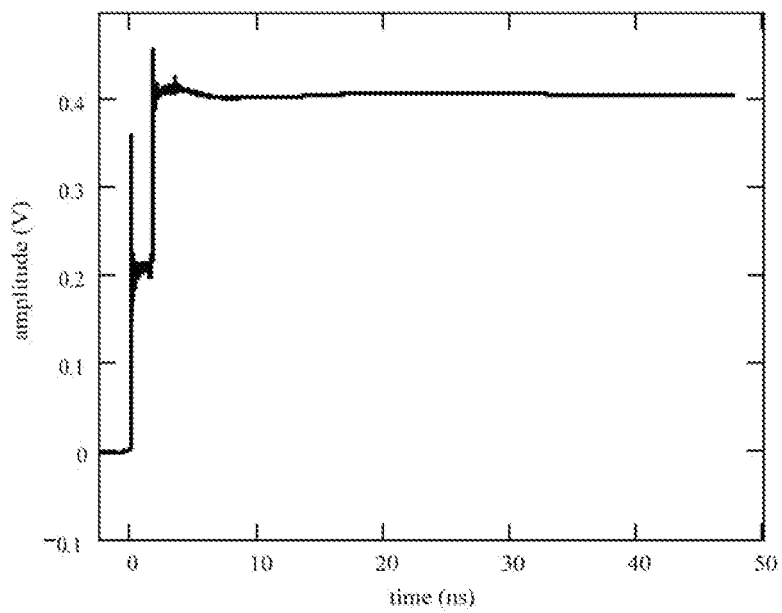
FIG. 5 is an example of a step measured by the pulser-sampler when the input port S1 of TDNA of FIG. 4 is connected to the internal open calibration standard.
Figure 6:
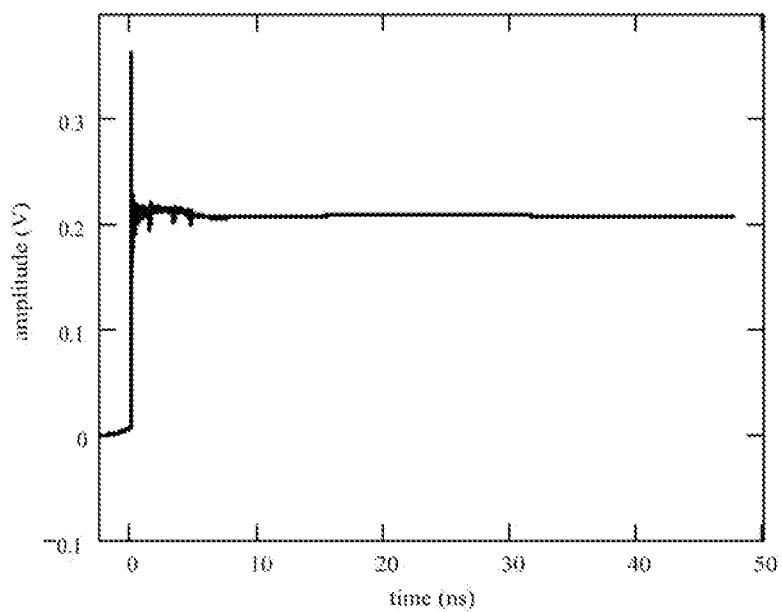
FIG. 6 is an example of a step measured by the pulser-sampler when the input ports S1 and S2 of TDNA of FIG. 4 are connected via the internal thru calibration standard.
Figure 7:
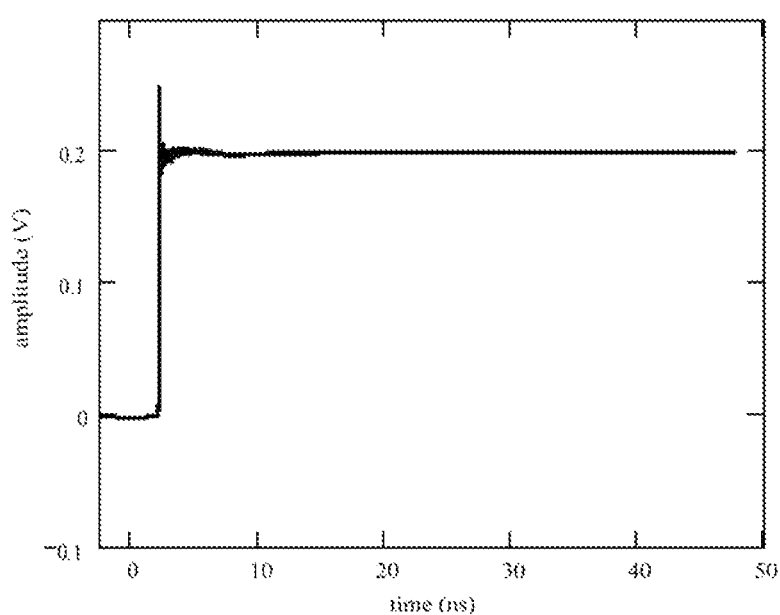
FIG. 7 is an example of a step measured by the sampler connected to port S2 when the input ports S1 and S2 of TDNA of FIG. 4 are connected via the internal thru calibration standard.

Each switch may be switched to a position through an external control, or other central control system. For example in FIG. 4, the switch RS1 can be switched to any one of the positions marked by numbers ranging from two to seven. If RS1 is switched to position three, then input port S1 is now connected to the open calibration standard marked as O. An example of a step measured by the pulser-sampler when RS1 is switched to open calibration standards is shown in FIG. 5. Any step measured by the sampler in the pulser-sampler is a combination of the input step as well as the reflected signal from port S1. Such a step is referred to as the reflected step, since it corresponds to the reflections at port S1 due to the input stimulus. The reflections can be either due to the calibration standards, or due to any of the DUT ports connected to S1. A thru calibration standard is the path that connects input port S1 to the other input port S2. This can be achieved by switching RS1 to position seven and simultaneously switching RS4 to position six. Thus an input step applied at port S1 is transmitted through the thru calibration standard and may be measured at port S2. FIG. 6 shows the reflected step at port S1 measured by the pulser-sampler when the input ports are connected via the thru standard. FIG. 7 shows the step that goes through the thru standard and is measured by the other sampler connected to the input port marked S2. The step measured by this sampler can either be transmitted via the thru calibration standard or via the DUT through the DUT-ports connected to input ports S1 and S2. Such a step is referred to as the transmitted step.

Since calibrating the TDNA requires the knowledge of these calibration standards, they are measured at the time of manufacture and stored in a file preferably internal to the fixture. Thus for an automatic SOLT type of calibration method there will preferably be four files saved on the disk. This can be achieved by using a VNA or a similar instrument with high dynamic range.

To save the files for SOLT calibration, following procedure is followed:
  Disconnect any pulsers and/or samplers from the input ports S1 and S2.
  Connect port one of a calibrated VNA to S1 and port two of the calibrated VNA to S2.
  Switch RS1 to position two. Port one of the VNA is now connected to Short calibration standard. Save the VNA measurement and identify it as the short calibration standard.
  Switch RS1 to position three. Port one of the VNA is now connected to Open calibration standard. Save the VNA measurement and identify it as the open calibration standard.
  Switch RS1 to position four. Port one of the VNA is now connected to Load calibration standard. Save the VNA measurement and identify it as the load calibration standard.
  Switch RS1 to position seven and simultaneously switching RS4 to position six. The thru standard is now connected between the two ports of the VNA. Save the VNA measurement and identify it as the thru calibration standard.

If a different automatic calibration technique is required, then different calibration standards may preferably be connected instead of the ones indicated above. Indeed, any number of calibration standards may be connected by using additional switches. For example a switch similar to RS1 may be used to connect six additional calibration standards. In order to do so, one may connect the common port of the new switch, say RS2, to unused position five of RS1. One then may switch RS1 to position five and RS2 to the position where the desired calibration standard is connected. Thus one may connect either multiple short, open, load or thru standards for SOLT type calibration or one may connect different standards depending on the calibration technique preferred.

Making reference once again to FIG. 4, the calibration standards are connected to the pulser and samplers at the interface of S1 and S2. Hence this is the reference plane of the unit. Non-idealities in pulser and sampler and the cables and connectors used to connect the pulser and sampler to ports S1 and S2 will be accounted for by the calibration algorithm and any raw s-parameter measurements at this reference plane can be converted to a calibrated measurement.

Making reference once again to FIG. 4, suppose a four port DUT is connected to the TDNA, such that port one of the DUT is connected to D1, port two of the DUT is connected to D2, port three of the DUT is connected to D3 and port four of the DUT is connected to D4. To measure $S_{ii}$, $i \in 1, 2, 3, 4$ of the DUT, one would need to apply an input stimulus at port i of the DUT and measure the reflected step from port i, with all the other ports terminated with the termination. To measure $S_{ij}$, $i \neq j$ and $i,j \in 1, 2, 3, 4$, one needs to apply the input stimulus at port j of the DUT and measure the transmitted signal at port i with all the other ports terminated with the known termination. In accordance with the inventive TDNA, both measurements can be made simultaneously. For example, to measure $S_{22}$ and $S_{32}$, one needs to apply the input stimulus to port two of the DUT and measure the reflected step from port two and the transmitted step from port three of the DUT respectively. This can be achieved by switching the RS1 to position six, thereby connecting it to RS3. Simultaneously switching RS3 to position three and RD2 to position two, to connect RD2 and RS3 provides the desired result. Thus, a connection is created between the pulser and port two of the DUT that is connected to fixture port marked D2. The pulser can apply the input to port two of the DUT, and measure the reflections from the same port. To measure the reflections from port three of the DUT, one only needs to make a connection between the sampler and the fixture port marked D3. This is achieved by switching RS4 to position four and simultaneously switching RD3 to position four. Also terminate ports one and four of the DUT by the known termination. This is achieved by switching the switches RD1 and RD4 to position two. Once all the switch positions are set, an input stimulus is applied by the pulser-sampler and reflections measured by the pulser-sampler and the other sampler.

Figure 8:
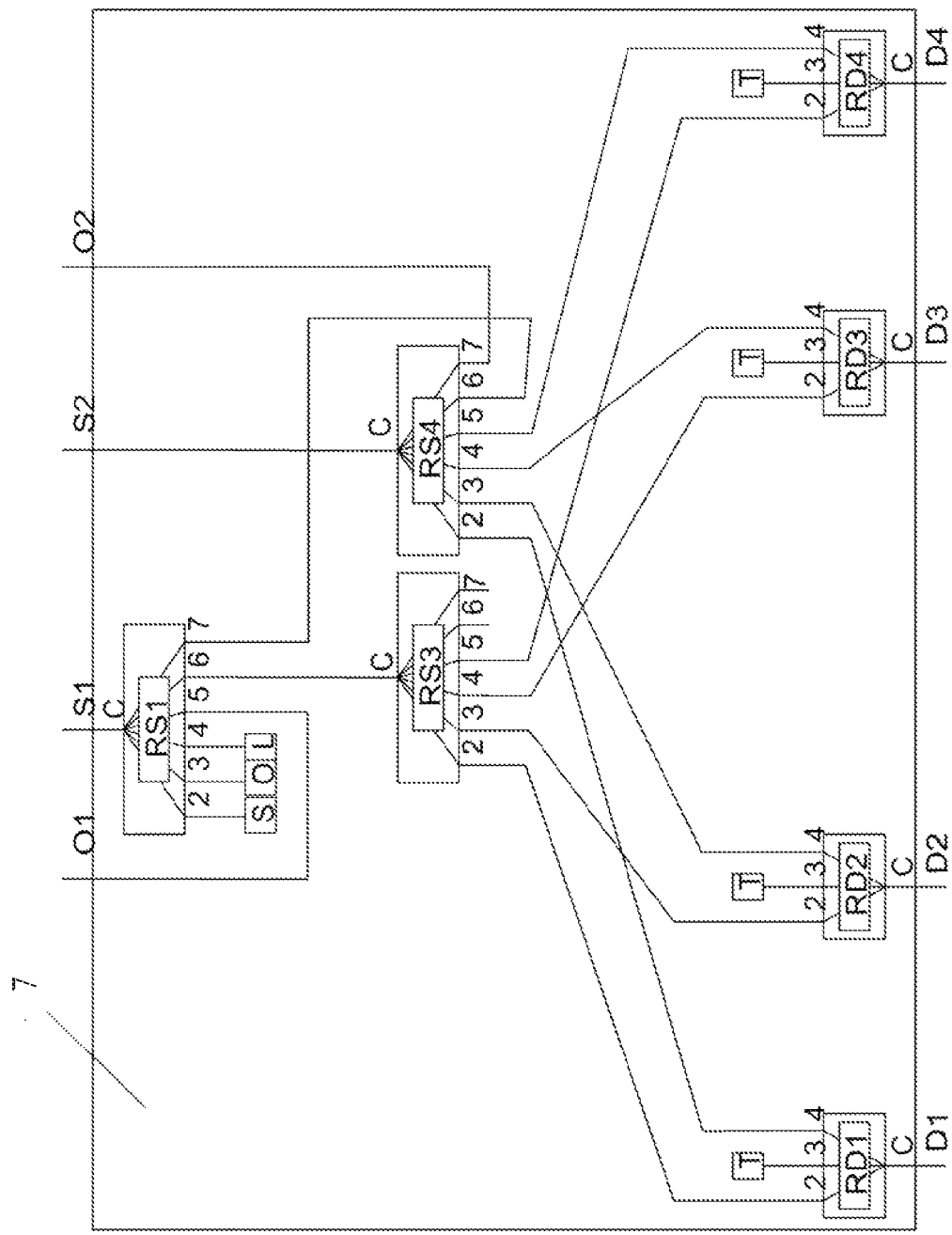
FIG. 8 is a wiring diagram depicting a fixture that may be connected to the TDNA in FIG. 4 to make a TDNA capable of measuring s-parameters of a DUT with more than four ports.
Figure 9:
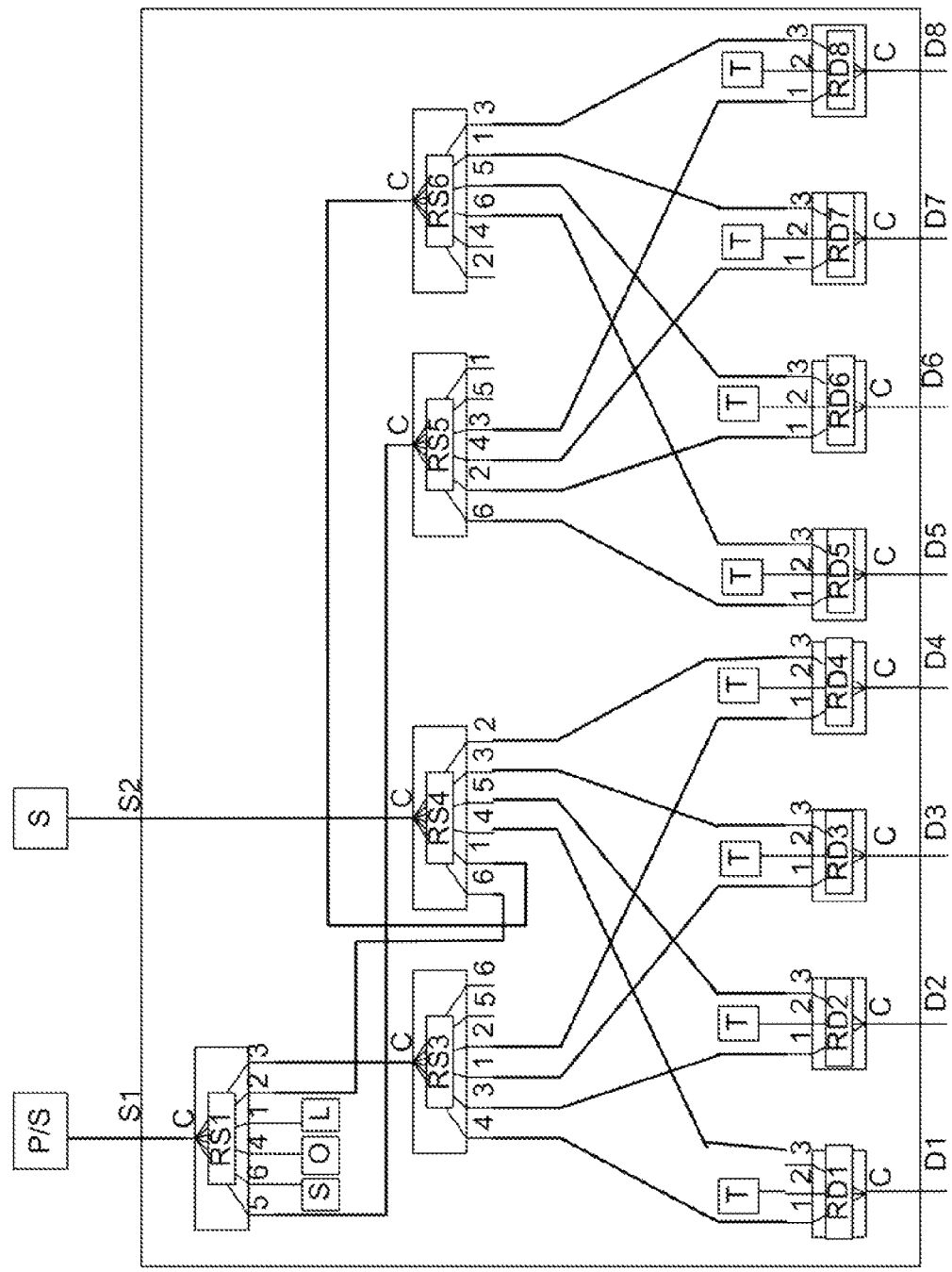
FIG. 9, in accordance with an embodiment of the invention, is a wiring diagram depicting an embodiment of the time domain network analyzer capable of measuring s-parameters of a DUT with up to eight ports.

To construct a TDNA in accordance with the various embodiments of the present invention in order to preferably measure s-parameters of a multiple port DUT with fewer pulsers and samplers, the inventors of the present invention have developed a number of different fixture types. In accordance with one or more embodiments of the invention, two or more fixtures may be connected to each other, or pulser and samplers can be connected to each fixture. A basic fixture [6], shown and described above in FIG. 4 may be used in the inventive TDNA to measure the s-parameters of up to four port DUT. This fixture may be modified so that it can be extended to connect to other fixtures. TDNA module [7] shown in FIG. 8 may be connected to the ports marked O1 and O2 of the TDNA shown in FIG. 4, thus constructing a TDNA module capable of measuring s-parameters of a DUT with up to eight ports. FIG. 9 is an example of such a TDNA. One may not connect cables and have ports O1 and O2 if the TDNA need not be extended.

Alternatively a TDNA capable of measuring s-parameters of a DUT with up to eight ports can be constructed by combining two TDNA's capable of measuring s-parameters of a DUT with up to four ports. In accordance with an alternative embodiment of the invention, such a TDNA will have two pulsers and four samplers.

Figure 10:
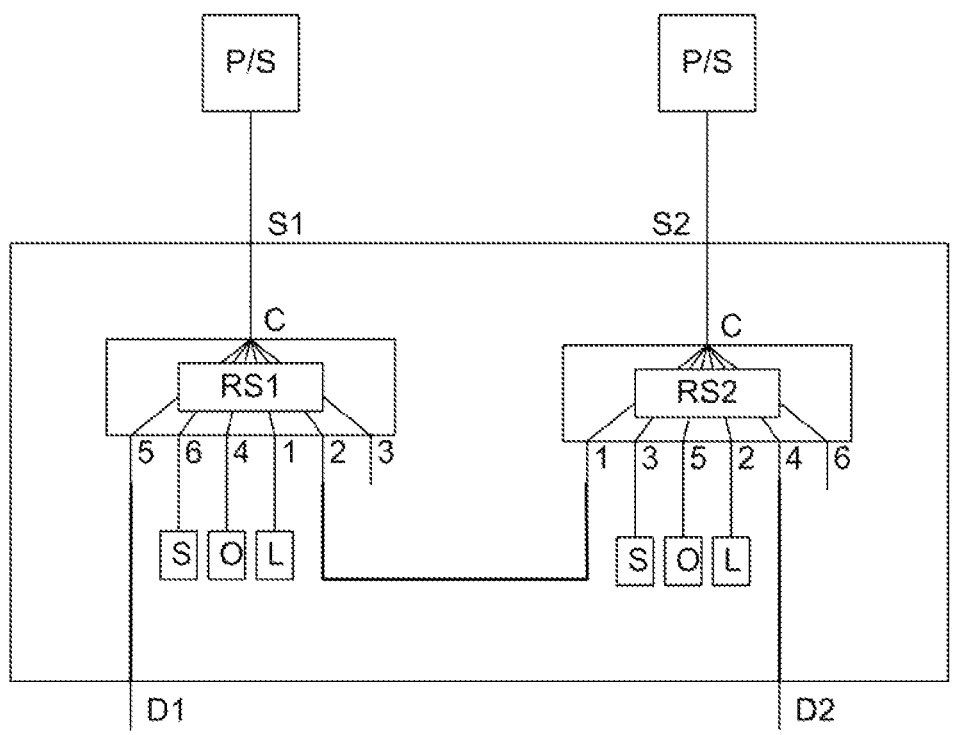
FIG. 10, in accordance with an embodiment of the invention, is a wiring diagram depicting an embodiment of the time domain network analyzer that uses two pulsers and two samplers to measure s-parameters of a DUT with up to two ports.

Although the TDNA shown in FIG. 4 may be used to measure DUT of two ports, there are other variations possible in accordance with various alternative embodiments of the invention based on the number of pulsers, calibration standards and or switches to be employed. For example, FIG. 10 depicts a TDNA that uses two pulsers to measure s-parameters of up to two port DUT.

To operate the TDNA automatically in accordance with one or more embodiments of the invention, for each DUT measurement, switches are preferably clicked automatically and step measurements are made by the pulser-sampler and the sampler. These steps and any measurements relating thereof are then saved before proceeding to the next DUT measurement. In order to do so, the inventors of the present invention describe a sequence table depicting various sequences of operations to be performed. Each entry of the table depicts one or more switch positions for a particular calibration measurement or a DUT measurement to be made. For the same TDNA, a sequence table may be different if the number of DUT ports is changed. For example, FIG. 11 depicts a sequence table used for measuring the s-parameter of a four port DUT connected to the TDNA shown in FIG. 4. Four ports of the DUT are connected such that port one of the DUT is connected to the TDNA port marked D1, port two of the DUT is connected to the TDNA port marked D2, port three of the DUT is connected to the TDNA port marked D3 and port four of the DUT is connected to the TDNA port marked D4.

Column one [8] in the table shown in FIG. 11 describes the measurement number. Such a measurement number is a way to index the measurements. Second column [9] indicates the type of the measurement, i.e. whether it is a calibration measurement (referred to as Cal) or a DUT measurement (referred to as Dut). Since the TDNA uses a SOLT calibration technique, the table in FIG. 11 describes the switch connections for such a calibration method. Column three [10] indicates whether the measurement is made by the sampler in the pulser-sampler. A true indicates that the step is the reflected step measured by the sampler in the pulser-sampler and a false indicates that the step is a transmitted step measured by the other sampler. Column four [11] has the DUT port number that is excited by the input. For calibration measurement, none of the DUT ports are excited and hence the value is zero. Similarly column five [12] has the DUT port number that is connected to the sampler. Again for calibration measurement, none of the DUT ports are measured and hence the value is zero. Column six [13] indicates the connection for switch RS1. For example, for measurement number one, RS1 is connected to a short calibration standard and hence an S in that position. Similarly column seven to twelve indicate the connections for switches RS3, RS4, RD1, RD2, RD3 and RD4 respectively. For example, for measurement number seven, DUT port one is driven and DUT port two is measured. In order to do so, switches are switched so that port one of the DUT is connected to the pulser, port two of the DUT is connected to the sampler, ports three and four of the DUT are connected to the known termination. The table describes the switch settings for such a case: RS1 is connected to RS3, RS3 is connected to RD1, RS4 is connected to RD2, RD1 is connected to RS3, RD2 is connected to RS4 and switches RD3 and RD4 are connected to their respective load calibration standard.

Note that for the sequence table shown in FIG. 11, the first five measurements are calibration measurements for SOLT calibration type. For measurement numbers four and five, the input ports are connected to each other through switches RS1 and RS3. For measurement four the reflected step is measured by the pulser-sampler and for measurement five the transmitted step is measured by the other sampler. Since both of these measurements can e made at the same time, both the measurements have the same switch settings. Also note that the switch settings for DUT measurements are repeated. For example, measurement number six and seven have the same switch settings, measurement numbers eight and nine have the same switch settings and so on. This is the case because, for each of the DUT measurements, the same DUT port is excited and the measurements are made by the pulser-sampler in one and by the sampler in the other. For example for measurement number eight, DUT port two is excited with the input stimulus and the reflected step from the same port is measured by the pulser-sampler. For measurement number nine, DUT port two is excited and the step transmitted from DUT port two to DUT port one is measured by the sampler. Both the measurements can be made simultaneously. There are a total of twenty four DUT measurements in the sequence table. Ideally one requires only sixteen measurements (square of DUT ports), but there are more shown and employed because the measurements for $S_{ii}$, i∈1, 2, 3, 4 are repeated thrice. That is because $S_{ii}$ is measured each time $S_{ji}$, j=i, j∈1, 2, 3, 4 is measured. The algorithm (described in the above-referenced copending patent application Ser. No. 13/017,394, filed Jan. 31, 2011, titled Time domain reflectometry step to s-parameter conversion) used to calculate the DUT s-parameters is able to handle such multiple measurements.

Thus to automatically measure all the steps to characterize the DUT, depending on the number of DUT ports, a sequence table is prepared for the particular set of measurements, is then read by the program, and the switches switched for each measurement number. At each of the steps measurements are made and stored along with other relevant information like the measurement type, driven DUT port and measured DUT port etc. Once the steps for a row in the sequence table are saved, the process proceeds to the next measurement number and the procedure is repeated. If the number of DUT ports is different from four, then the sequence table will be different. For example, if the number of DUT ports is three, then a possible sequence table is shown in FIG. 12 (assuming that the DUT ports one through three are connected to TDNA ports marked D1 through D3 respectively).

An algorithm described in the above-referenced copending patent application Ser. No. 13/017,394, filed Jan. 31, 2011, titled Time domain reflectometry step to s-parameter conversion may be used to calculate the s-parameters of the DUT from the step measurements. In order to do so, one needs to characterize the fixture for each DUT measurement. One way to characterize the fixture is to measure the s-parameters of the fixture. Since different switch connections are used for calibration measurements and different DUT measurements, the fixture is different for each of those measurements. Hence s-parameters of the fixture need to be measured for each measurement described in the sequence table. For example if we consider the TDNA for measuring up to four port DUT, the sequence table in FIG. 11 describes all necessary switch connections. One way to characterize the fixture for each measurement condition, is to remove the pulser and sampler connected to the fixture. Now the fixture is effectively a six-port passive component. A VNA or a VNA-like instrument can be used to measure the s-parameters of a six-port fixture. For each measurement condition, the switches may be set as described in the corresponding row, and the s-parameters can be measured and stored in a file. Note that for the DUT measurements, some switch connections are repeated. For this case of characterizing the fixture only one measurement for each switch configuration is required.

Figure 13:
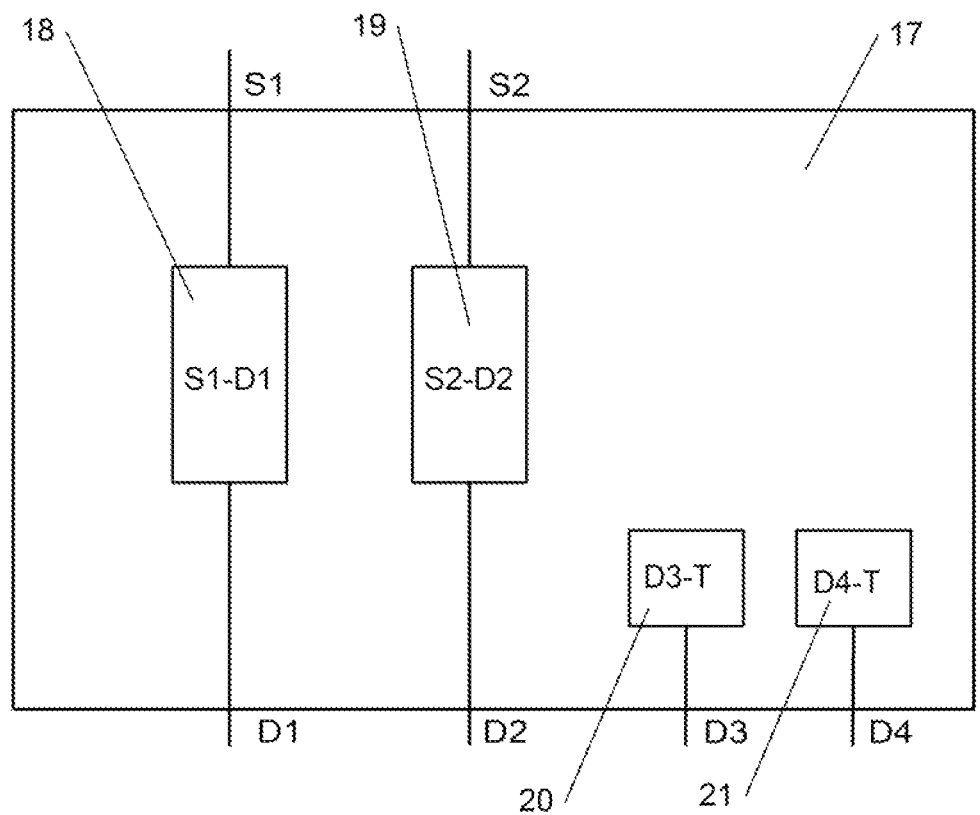
FIG. 13, in accordance with an embodiment of the invention, is a preferred way of converting different two port s-parameter measurements of the fixture into one six port s-parameter measurement of the fixture.

Another possible way of characterizing the fixture in accordance with an embodiment of the invention is to identify all possible switch paths in the fixture. For the example of the TDNA for up to four port DUT, the possible switch paths are that from S1 to D1, S1 to D2, S1 to D3, S1 to D4, S1 to S, S1 to O, S1 to L, S1 to S2, S2 to D1, S2 to D2, S2 to D3, S2 to D4, D1 to T, D2 to T, D3 to T and D4 to T. Of these sixteen measurements nine are two port measurements while seven are one port measurements. Using these sixteen measurements, one can generate the s-parameters of the six port fixture. The underlying assumption being that there is sufficient switch isolation. For example, if the path from S1 to D1 is connected, and if the s-parameters of the path from S1 to D2 is measured, then that would be sufficiently below the result accuracy desired. As an example FIG. 13 demonstrates one way of converting the two port and one port s-parameter measurements into a six port fixture [14] s-parameter. FIG. 13 corresponds to the fixture for measurement number six and seven in the sequence table show in FIG. 11. Since this measurement requires the port one of the DUT be connected to S1 and port two of the DUT be connected to S2, and ports three and four of the DUT be connected to the internal terminations, one requires the s-parameter measurements from S1 to D1 [15], S2 to D2 [16], D3 to T [17] and D4 to T [18].

While an automatic calibration procedure in accordance with the invention has been described incorporating the described fixture, it should be noted that a manual calibration may also be performed if desired by setting the switches appropriately. Sequence table for manual calibration for measuring two port DUT is described in FIG. 14. The sequence assumes that the DUT is connected to ports D1 and D2 of the TDNA unit. The first three rows of the table describe the switch connections to perform a one-port calibration for port D1. For each of the measurements, switch RS1 is connected to RS3, RS3 is connected to RS1, RS4 is connected to RD2, RD1 is connected to RS3 and RD2 through RD4 are connected to L. A known one port calibration standard is then connected to port D1, an input signal is applied and reflections are measured by the pulser. Similarly, measurements four to six describe the switch connections to calibrate port D2. The known one port calibration standard is then connected to port D2, the input signal is applied and the reflections are measured by the pulser. For a two port calibration standard, a known through standard is connected between ports D1 and D2. For the first measurement, the switches are set according to measurement condition seven. The input signal is applied and reflections measured by both the pulser and sampler. For the second measurement, the switches are set according to measurement condition nine. The input signal is applied and reflections measured by both the pulser and sampler. These measurements are therefore sufficient to perform a manual calibration of the unit.

The proposed system in accordance with the various described embodiments of the invention, unlike any other prior art systems, is therefore capable of measuring the d port DUT s-parameters by using only one pulser and two samplers. The algorithm (described in the above-referenced copending patent application Ser. No. 13/017,394, filed Jan. 31, 2011, titled Time domain reflectometry step to s-parameter conversion) used to calculate the DUT s-parameters is able to operate with more than one pulser and sampler, if available.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that this description is intended to cover all of the generic and specific features of the invention herein described and all statements of the scope of the invention which, as a matter of language, might be said to fall there between.

What is claimed is:

1. A time domain network analyzer, comprising:
   one pulser for generating a stimulus signal; a plurality of samplers for measuring responses;
   a plurality of device ports adapted to be connected to a device under test;
   a first group of one or more switches for switching the pulser between one or more of the plurality of device ports and for switching a plurality of the plurality of samplers between a plurality of the plurality of device ports; and
   a second group of one or more switches for switching the pulser between one or more of the internal calibration standards and for switching one or more of the plurality of samplers between one or more of the internal calibration standards.

2. The time domain network analyzer of claim 1, further comprising one or more internal calibration standards.

3. The time domain network analyzer of claim 1, wherein the time domain network analyzer is adapted to calibrate the time domain network analyzer to an internal reference plane employing the one or more internal calibration standards, and to de-embed paths between the pulser and the one or more samplers, and one or more of the plurality of device ports.

4. The time domain network analyzer of claim 1, further comprising one or more terminations.

5. The time domain network analyzer of claim 4, further comprising a second group of one or more switches for switching the one or more device ports between one or more of the one or more terminations.

6. The time domain network analyzer of claim 4, wherein the one or more terminations are internal.

7. The time domain network analyzer of claim 1, further comprising: one or more internal calibration standards; and one or more terminations.

8. The time domain network analyzer of claim 7, further comprising:
   a third group of one or more switches for switching the one or more device ports between one or more of the one or more terminations.

9. A time domain network analyzer, comprising:
   one or more pulsers for generating a stimulus signals;
   one or more samplers for measuring responses;
   one or more internal calibration standards;
   one or more device ports adapted to be connected to a device under test;
   a first group of one or more switches for switching the pulser between one or more of the one or more device ports and for switching one or more of one or more samplers between one or more of the one or more device ports; and
   a second group of one or more switches for switching the one or more pulsers between one or more of the internal calibration standards and for switching one or more of the one or more samplers between one or more of the internal calibration standards.

10. The time domain network analyzer of claim 9, wherein the time domain network analyzer is adapted to calibrate the time domain network analyzer to an internal reference plane employing the one or more internal calibration standards, and to de-embed paths between the one or more pulsers and the one or more samplers, and one or more of the one or more device ports.

11. The time domain network analyzer of claim 9, further comprising one or more terminations.

12. The time domain network analyzer of claim 11, further comprising a second group of one or more switches for switching the one or more device ports between one or more of the one or more terminations.

13. The time domain network analyzer of claim 12, wherein the one or more terminations are internal.

* * * * *